US008603244B2

United States Patent
Pei

(10) Patent No.: US 8,603,244 B2
(45) Date of Patent: Dec. 10, 2013

(54) VAPOR DEPOSITION DEVICE

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 994 days.

(21) Appl. No.: 12/691,892

(22) Filed: Jan. 22, 2010

(65) Prior Publication Data
US 2011/0036293 A1 Feb. 17, 2011

(30) Foreign Application Priority Data

Aug. 14, 2009 (CN) .......................... 2009 1 0305619

(51) Int. Cl.
*C23C 16/00* (2006.01)

(52) U.S. Cl.
USPC ........ 118/719; 118/726; 118/723 R; 118/727; 118/723 FI

(58) Field of Classification Search
USPC .................. 118/719, 726–727, 723 FI, 723 R
See application file for complete search history.

(56) References Cited

U.S. PATENT DOCUMENTS

| 4,217,855 | A | * | 8/1980 | Takagi | 118/719 |
|---|---|---|---|---|---|
| 4,281,029 | A | * | 7/1981 | Takagi et al. | 427/523 |
| 4,632,059 | A | * | 12/1986 | Flatscher et al. | 118/727 |
| 4,866,239 | A | * | 9/1989 | Egermeier | 219/121.15 |
| 4,868,003 | A | * | 9/1989 | Temple et al. | 118/719 |
| 5,302,209 | A | * | 4/1994 | Maeda et al. | 118/719 |
| 5,525,158 | A | * | 6/1996 | Tsukazaki et al. | 118/723 CB |
| 5,597,622 | A | * | 1/1997 | Zoller et al. | 427/563 |
| 5,656,141 | A | * | 8/1997 | Betz et al. | 204/298.05 |
| 6,319,326 | B1 | * | 11/2001 | Koh et al. | 118/718 |
| 2004/0083975 | A1 | * | 5/2004 | Tong et al. | 118/728 |
| 2007/0123007 | A1 | * | 5/2007 | Furutani et al. | 438/478 |
| 2008/0041307 | A1 | * | 2/2008 | Nguyen et al. | 118/715 |
| 2013/0160710 | A1 | * | 6/2013 | Pei | 118/723 E |

FOREIGN PATENT DOCUMENTS

JP 03056675 A * 3/1991

* cited by examiner

*Primary Examiner* — Karla Moore
*Assistant Examiner* — Charlee Bennett
(74) *Attorney, Agent, or Firm* — Altis Law Group, Inc.

(57) ABSTRACT

A vapor deposition device includes a base, a hollow rod, a bracket, four bearing seats, and an ion source. The base defines a through hole and four grooves in one surface thereof. The hollow rod is inserted in the through hole and defines four vents in the circumferential direction thereof. The vents point to the upper space of the grooves correspondingly. The hollow rod includes a closed end and an opposite opened end. The bracket is connected to the closed end. The bearing seats are fixed to the bracket so that the bearing seats face the grooves respectively. The ion source is coupled to the opened end. Ions emitted by the ion source are guided by the hollow rod to the vents and the upper spaces of the grooves respectively.

9 Claims, 4 Drawing Sheets

VAPOR DEPOSITION DEVICE

BACKGROUND

1. Technical Field

This present disclosure relates to coating technology and, particularly, to a vapor deposition device.

2. Description of Related Art

Current deposition devices typically include a vapor deposition chamber, a supporting umbrella, a crucible, and an ion source. The supporting umbrella, the crucible, and the ion source are disposed within the vapor deposition chamber. The crucible and the ion source are disposed beneath the supporting umbrella. In operation, substrates to be coated are supported by the supporting umbrella, facing the crucible and the ion source. A precursor is added to the crucible and vaporized into a corresponding precursor gas. The ion source emits ions to ionize (oxidize) the precursor gas to form a corresponding coating material gas which is deposited on the substrates. A challenging scenario of utilizing such a deposition device is where more than one crucible for more than one precursor is deployed but some of the crucibles fail to achieve position match with the ion source. Consequently, reduction of the purity of the coating is likely as some of the precursor gas may not be fully oxidized by the ions and directly deposited on the substrate.

Therefore, it is desirable to provide a vapor deposition device, which can overcome the above-mentioned limitations.

DETAILED DESCRIPTION

Figure 1:
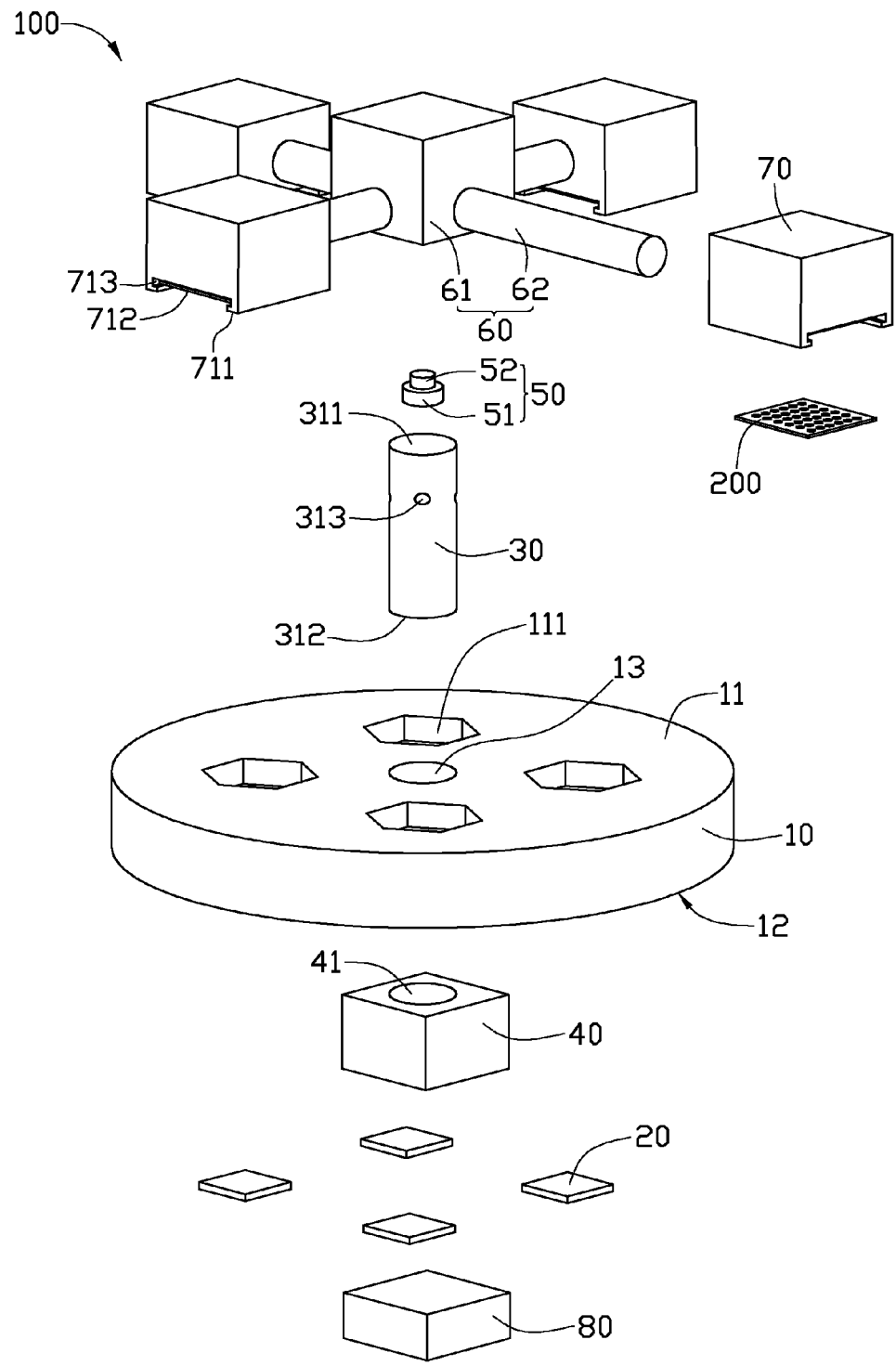
FIG. 1 is an isometric and exploded view of a vapor deposition device, according to an exemplary embodiment.

Referring to FIG. 1, a vapor deposition device 100, according to an exemplary embodiment, is used for coating four substrates 200. The vapor deposition device 100 includes a base 10, four heat sources 20, a rod 30, an ion source 40, a motor 50, a bracket 60, four bearing seats 70, and a control module 80.

The base 10 is disk-like and includes an upper surface 11 and a bottom surface 12. The base 10 defines a through hole 13 generally through the center of the upper surface 11 and the bottom surface 12. The base 10 also defines four grooves 111 in the upper surface 11. The grooves 111 are arranged surrounding the through hole 13 and typically, are equidistantly distributed. The base 10 can be made of thermally isolative material. Therefore, the grooves 111 are thermally isolated from each other.

The heating sources 20 can be wires.

Figure 2:
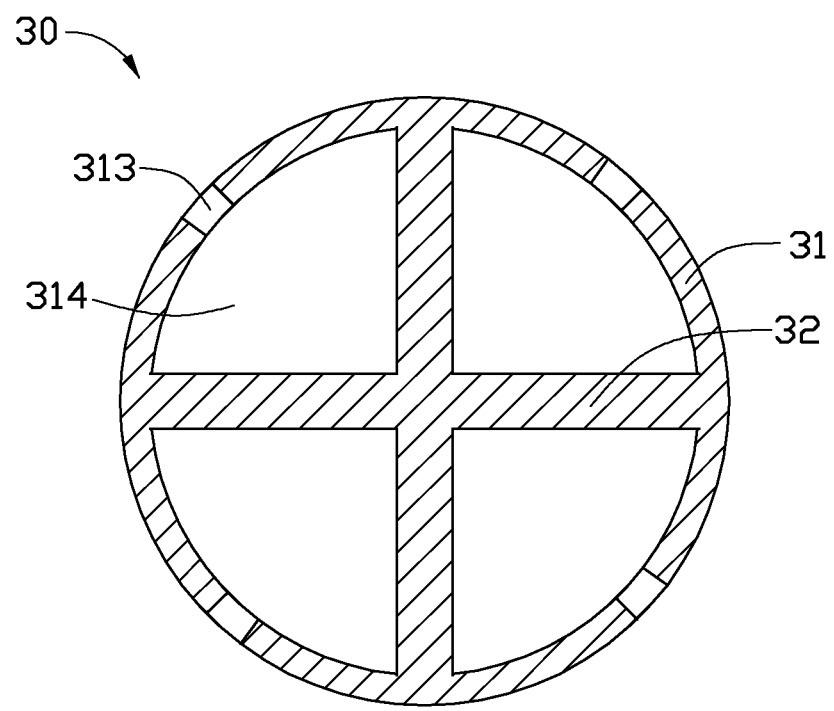
FIG. 2 is a cross-sectional view of a rod of the vapor deposition device of FIG. 1.

Also referring to FIG. 2, the rod 30 is hollow and includes an outer wall 31 and an elongated crisscross spacing sheet 32. The outer wall 31 includes a closed end 311 and an open end 312. The outer wall 31 defines four vents 313 therethrough along the circumference direction of the rod 30. The elongated crisscross spacing sheet 32 is fittingly inserted into the outer wall 31 to divide the inner space of the outer wall into four separated channels 314. Each channel 314 communicates with a corresponding vent 313. In particular, each channel 314 can have a valve (not shown). The valve can open or close the corresponding channel 314.

The ion source 40 is typically a block and defines an exit 41 in one surface thereof. The ion source 40 is configured for emitting ions via the exit 41.

The motor 50 includes a stator 51 and a rotor 52.

Figure 3:
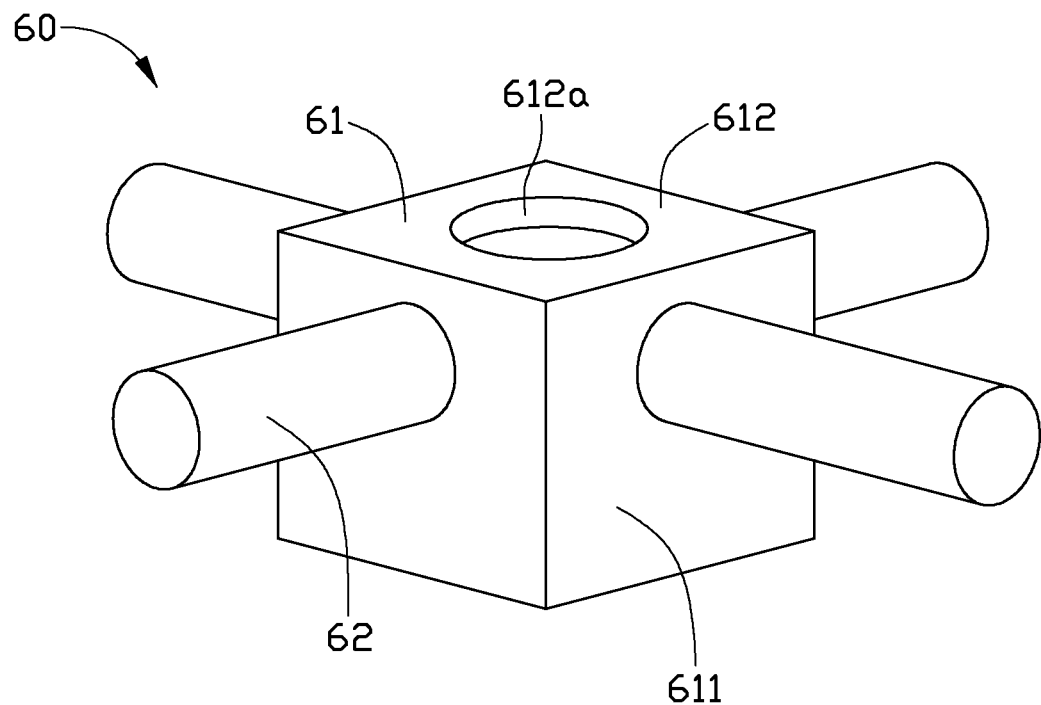
FIG. 3 is an isometric view of a bracket of the vapor deposition device of FIG. 1.

Referring to FIG. 3, the bracket 60 includes a connecting part 61 and four cantilevers 62. In this embodiment, the connecting part 61 is substantially a block which includes four side surfaces 611 and a lower surface 612. The connecting part 61 defines an engaging hole 612a in the lower surface 612. The cantilevers 62 project from the side surfaces 611 respectively.

Each bearing seat 70 includes a bearing surface 711 and defines a slot 712 in the bearing surface 712. The slot 712 extends into the bearing seat 70 to form two engaging grooves 713 at two opposite sides of the slot 712.

The control module 80 is configured for controlling the heating sources 20, the valves of the rod 30, the ion source 40, and the motor 50, and thereby coordinating the vapor deposition device 100.

Figure 4:
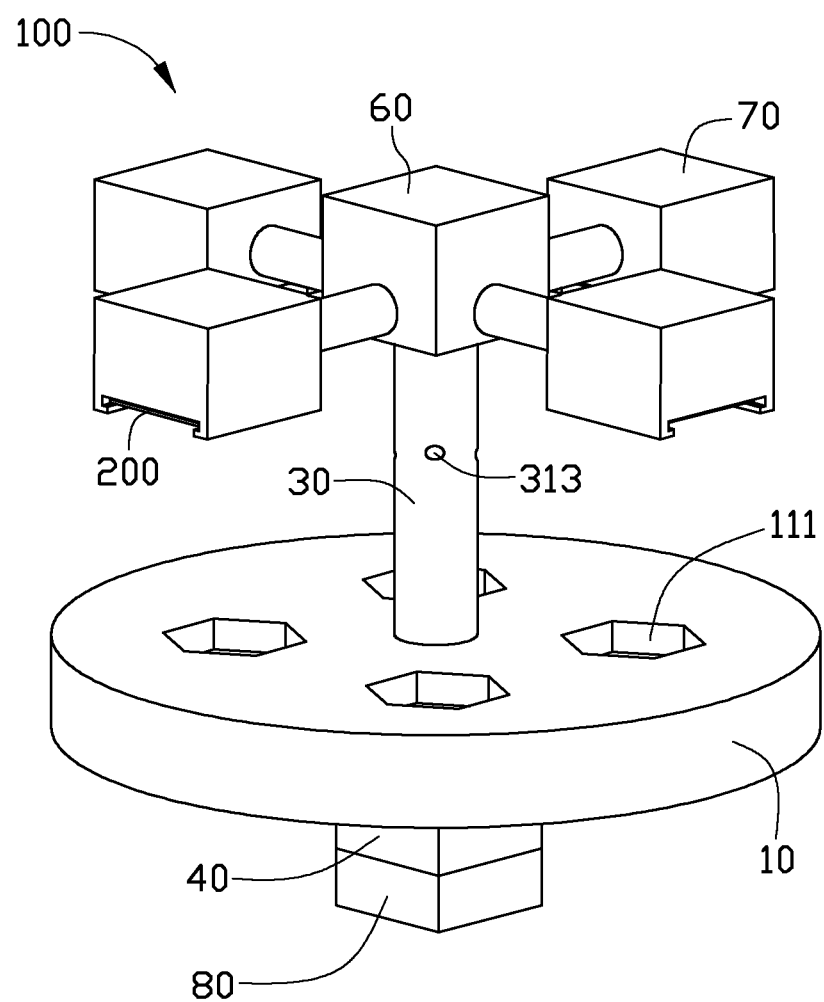
FIG. 4 is an isometric and assembled view of the vapor deposition device of FIG. 1.

Also referring to FIG. 4, in assembly, the heating sources 20 are disposed on the bottom of the grooves 111 respectively. The rod 30 is fittingly inserted through the through hole 13. The closed end 311 and the vents 313 are positioned above the base 10 (i.e., above the upper surface 11). Further, the vents 313 are positioned corresponding to the positions of the grooves 111 respectively. The opened end 312 is positioned below the base 10 (i.e., below the bottom surface 12). The opened end 312 is inserted into the circular exit 41 and typically fixed (e.g., sealed) by the ion source 40. Thus, each channel 314 communicates the ion source 40 with a corresponding vent 313 and is configured for guiding ions from the ion source 40 to the upper space of a corresponding groove 111. The stator 51 is disposed on the closed end 311. The rotor 52 is engaged with the engaging hole 612a. Thus, the motor 50 can rotate the bracket 60. The bearing seats 70 are fixed to the distal end of the cantilevers 62 respectively. The bearing surface 71 directly faces the grooves 111 respectively. The control module 80 is connected to the heating sources 20, the valves of the rod 30, the ion source 40, and the motor 50.

In operation, the substrates 200 are slid into the slots 712 respectively and two opposite edges thereof are engaged with the engaging grooves 713. Thus, the substrates 200 are removably seated in the bearing seats 70 respectively and supported thereby, facing the grooves 111 directly. Different precursors (not shown) needed to form desired coating materials are poured into the respective grooves 111. The control module 80 controls the heating sources 20 to heat the precursors to vaporize the precursors into corresponding precursor gases. The control module 80 also controls the ion source 40 to emit ions (not shown). The ions are guided to the upper space of the corresponding grooves via the channels 314 and the vents 313 while the precursor gases ascend to the upper space of the grooves 111 where they can be fully ionized by the ions due to perfect positioning between the grooves 111 and the vents 313.

It is noteworthy that where ionization of the corresponding precursor gases is unnecessary, the control module 80 can control the valves of the rod 30 to close some of the channels 314. Furthermore, several different types of ion sources can be integrated into one piece, but the one piece configured to allow the different source to be positioned within separate corresponding channels 314. Thus, ions of each type of ion source can be guided to the upper space of a groove 111 corresponding to a desired precursor by a dedicated channel 314. As such, undesirable mixture of different ion sources is avoidable. Additionally, if all precursors need the same type of ions, the vents 313 can share a common channel, and the elongated crisscross spacing sheet 32 can be omitted.

If different types of precursors are employed to deposit different layers on the substrates 200 in sequence, the control module 80 can control the motor 50 to rotate the bracket 60 by, for example, 90 degrees each time to position the substrates 200 to the upper space above a groove 111 corresponding to a desired subsequent precursor.

Configuration (e.g., the number and position) of the grooves 111, the heating sources 20, the vents 313, the channels 314, the cantilevers 62, and the bearing seats 70 are not only limited to the four used an example of this embodiment, but can be set depending on requirements. For example, the grooves 111, vents 313, and cantilevers 62 may be other than equidistantly arranged. Also, more or less than four grooves 111 and corresponding heating sources 20, vents 313, channels 314, cantilevers 62, and bearing seats 70 can be employed in alternative embodiments.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A vapor deposition device comprising:
    a base defining a through hole and a plurality of grooves in one surface thereof, the grooves being surrounding the through hole and configured for receiving precursors;
    a plurality of heating sources disposed in the grooves respectively for vaporizing the precursors into corresponding precursor gases;
    a hollow rod extending through the through hole and defining a plurality of vents along a circumference direction thereof, each of which points to an upper space of a corresponding groove, the hollow rod comprising an open end and an opposite closed end;
    a bracket connected to the closed end;
    a plurality of bearing seats fixed to the bracket for supporting a plurality of substrates to be coated, the substrates facing the grooves respectively; and
    an ion source coupled to the open end and configured for emitting ions; the hollow rod configured for guiding the ions to exit from the vents to the upper spaces of the corresponding grooves to ionize precursor gases ascending thereto.

2. The vapor deposition device of claim 1, where the grooves are equal-distantly arranged, the vents, the bearing seats being positioned surrounding to the through hole and equal-distantly arranged accordingly.

3. The vapor deposition device of claim 1, wherein the heating sources are resistance wires.

4. The vapor deposition device of claim 1, wherein the rod comprises an outer wall and a spacing sheet, the spacing sheet being received within the outer wall to space the inner space of the outer wall into a plurality of separated channels, each channel communicating the ion source to a corresponding vent and configured for guiding ions from the ion source to a corresponding vent.

5. The vapor deposition device of claim 4, wherein the ion source comprises different types of substances integrated into one piece; each substance being received within a corresponding channel for emitting a corresponding type of ions to an upper space of a desired precursor.

6. The vapor deposition device of claim 1, wherein the bracket comprises a connecting part and a plurality of cantilevers, the connecting part comprising a plurality of side surfaces and a lower surface connecting the side surfaces, the closed end being connected to the lower surface, the cantilevers projecting from the side surfaces respectively, the bearing seats being connected to the distal ends of the cantilevers respectively.

7. The vapor deposition device of claim 1, further comprising a motor, the motor interconnecting the bracket and the rod and configured for rotating the bracket to switch each bearing seat among the upper spaces of the grooves.

8. The vapor deposition device of claim 1, wherein each bearing seat comprises a bearing surface facing a corresponding grooves and defines a slot, the slot extending into the bearing seat to form two engaging grooves at opposite side of the slot for engagingly receiving opposite edges of a substrate.

9. The vapor deposition device of claim 1, further comprising a control module for coordinating the vapor deposition device.

* * * * *